(12) United States Patent
VanGilder et al.

(10) Patent No.: US 7,841,199 B2
(45) Date of Patent: Nov. 30, 2010

(54) COLD AISLE ISOLATION

(75) Inventors: James W. VanGilder, Pepperell, MA (US); Mark H. Germagian, Hudson, MA (US)

(73) Assignee: American Power Conversion Corporation, West Kingston, RI (US)

( * ) Notice: Subject to any disclaimer, the term of this patent is extended or adjusted under 35 U.S.C. 154(b) by 1125 days.

(21) Appl. No.: 11/131,503

(22) Filed: May 17, 2005

(65) Prior Publication Data

US 2006/0260338 A1 Nov. 23, 2006

(51) Int. Cl.
F25D 23/12 (2006.01)

(52) U.S. Cl. ........................................ 62/259.2; 62/407
(58) Field of Classification Search ................ 26/259.2, 26/407, 417; 361/688–691
See application file for complete search history.

(56) References Cited

U.S. PATENT DOCUMENTS

| | | | |
|---|---|---|---|
| 3,559,728 A | 2/1971 | Lyman et al. ................ 165/55 |
| 4,016,357 A | 4/1977 | Abrahamsen ................ 174/48 |
| 4,158,875 A | 6/1979 | Tajima et al. .............. 361/384 |
| 4,261,519 A | 4/1981 | Ester .......................... 239/548 |
| 4,710,096 A | 12/1987 | Erlam ...................... 415/121 G |
| 4,774,631 A | 9/1988 | Okuyama et al. .......... 361/384 |
| 4,832,717 A | 5/1989 | Peters ......................... 55/473 |
| 4,837,663 A | 6/1989 | Zushi et al. ................ 361/384 |
| 4,851,965 A | 7/1989 | Gabuzda et al. ........... 361/383 |
| 4,874,127 A | 10/1989 | Collier ...................... 236/49.5 |
| 5,173,819 A | 12/1992 | Takahashi et al. ........ 360/97.03 |
| 5,232,401 A | 8/1993 | Fujita et al. ................ 454/187 |
| 5,416,427 A | 5/1995 | Tracewell .................. 324/754 |
| 5,544,012 A | 8/1996 | Koike ......................... 361/695 |
| 5,657,641 A | 8/1997 | Cunningham et al. ........ 62/263 |
| 5,671,805 A | 9/1997 | Ståhl et al. ................. 165/80.3 |
| 5,709,100 A | 1/1998 | Baer et al. ................ 62/259.2 |
| 5,718,628 A | 2/1998 | Nakazato et al. .......... 454/184 |
| 5,788,467 A | 8/1998 | Zenitani et al. ............ 417/360 |

(Continued)

FOREIGN PATENT DOCUMENTS

DE 198 17 917 A1 10/1999

(Continued)

OTHER PUBLICATIONS

IBM Technical Disclosure Bulletin, May 1989, "Improved Cooling System for Rack-Mounted Equipment", 31(12):140-141.

(Continued)

*Primary Examiner*—Melvin Jones
(74) *Attorney, Agent, or Firm*—Townsend and Townsend and Crew LLP (57) ABSTRACT

A data center cooling solution providing techniques for using baffles, doors and roof sections to prevent warm air from being entrained into a cold aisle in a data center, wherein the data center generally contains an air cooling system and a raised floor structure. The raised floor structure is configured to deliver cool air into the data center through a plurality of grates and perforated tiles in the floor. Electronic equipment racks are disposed around the grates and perforated tiles, such that the front faces of the equipment racks face the grates and perforated tiles. A collection of baffles, doors or roof sections inhibit the mixing of the cool air delivered by the air cooling system and the warm air exhausted by the electronic equipment.

12 Claims, 7 Drawing Sheets

U.S. PATENT DOCUMENTS

| | | | |
|---|---|---|---|
| 5,934,368 A | 8/1999 | Tanaka et al. | 165/233 |
| 5,943,219 A | 8/1999 | Bellino et al. | 361/816 |
| 5,949,646 A | 9/1999 | Lee et al. | 361/695 |
| 5,982,652 A | 11/1999 | Simonelli et al. | 363/142 |
| 6,041,851 A | 3/2000 | Diebel et al. | 165/104.33 |
| 6,065,531 A | 5/2000 | Schneider et al. | 165/122 |
| 6,164,369 A | 12/2000 | Stoller | 165/104.33 |
| 6,185,098 B1 | 2/2001 | Benavides | 361/695 |
| 6,185,481 B1 | 2/2001 | Kondou et al. | 700/275 |
| 6,186,890 B1 | 2/2001 | French et al. | 454/184 |
| 6,193,601 B1 | 2/2001 | Torczynski | 454/187 |
| 6,198,628 B1 | 3/2001 | Smith | 361/695 |
| 6,222,729 B1 | 4/2001 | Yoshikawa | 361/695 |
| 6,264,550 B1 | 7/2001 | Matsumoto | 454/187 |
| 6,290,597 B1 | 9/2001 | Jones et al. | 454/303 |
| 6,305,180 B1 * | 10/2001 | Miller et al. | 62/259.2 |
| 6,347,627 B1 | 2/2002 | Frankie et al. | 128/201.21 |
| 6,359,565 B1 | 3/2002 | Pedoeem et al. | 340/584 |
| 6,362,958 B1 | 3/2002 | Yu et al. | 361/687 |
| 6,374,627 B1 | 4/2002 | Schumacher et al. | 62/259.2 |
| 6,375,561 B1 | 4/2002 | Nicolai et al. | 454/184 |
| 6,400,567 B1 | 6/2002 | McKeen et al. | 361/695 |
| 6,412,292 B2 | 7/2002 | Spinazzola et al. | 62/89 |
| 6,434,954 B1 | 8/2002 | Hess et al. | 62/89 |
| 6,463,997 B1 | 10/2002 | Nicolai et al. | 165/80.2 |
| 6,494,050 B2 | 12/2002 | Spinazzola et al. | 62/89 |
| 6,506,111 B2 | 1/2003 | Sharp et al. | 454/184 |
| 6,516,954 B2 | 2/2003 | Broome | 211/26 |
| 6,672,955 B2 * | 1/2004 | Charron | 454/184 |
| 6,772,604 B2 * | 8/2004 | Bash et al. | 62/259.2 |
| 6,859,366 B2 * | 2/2005 | Fink | 361/690 |
| 7,251,547 B2 * | 7/2007 | Bash et al. | 700/276 |
| 2001/0029163 A1 | 10/2001 | Spinazzola et al. | 454/184 |
| 2001/0042616 A1 | 11/2001 | Baer | 165/299 |
| 2002/0007643 A1 | 1/2002 | Spinazzola et al. | 62/259.2 |
| 2002/0185262 A1 | 12/2002 | Baer | 165/104.22 |
| 2003/0050003 A1 | 3/2003 | Charron | |
| 2004/0184232 A1 | 9/2004 | Fink | |
| 2004/0218355 A1 | 11/2004 | Bash et al. | |
| 2004/0223300 A1 | 11/2004 | Fink et al. | |
| 2005/0099770 A1 | 5/2005 | Fink | |

FOREIGN PATENT DOCUMENTS

| | | |
|---|---|---|
| EP | 0 190 835 A1 | 8/1986 |
| EP | 0 621 451 A2 | 10/1994 |
| JP | 62-202949 | 9/1987 |
| JP | 63-222916 | 9/1988 |
| JP | 1-273395 | 11/1989 |
| JP | 2-98197 | 4/1990 |
| JP | 2-192534 | 7/1990 |
| JP | 3-85797 | 4/1991 |
| JP | 3-177096 | 8/1991 |
| JP | 4-368199 | 12/1992 |
| JP | 5-106888 | 4/1993 |
| JP | 5-235570 | 9/1993 |
| JP | 7-228249 | 8/1995 |
| JP | 2002-156136 | 5/2002 |
| JP | 2003166729 A | 6/2003 |
| WO | WO 98/45934 | 10/1998 |
| WO | WO 01/62060 A1 | 8/2001 |
| WO | WO 02/12797 A2 | 2/2002 |

OTHER PUBLICATIONS

International Search Report for International Application No. PCT/US2006/016253 dated Jul. 30, 2007, 1 page.

Supplementary European Search Report for European Application No. EP06751774 dated Jul. 8, 2009, 2 pages.

* cited by examiner

COLD AISLE ISOLATION

BACKGROUND OF THE INVENTION

Communications and information technology equipment is commonly mounted in racks or enclosures. Equipment racks and enclosures are used to contain and to arrange communications and information technology equipment, such as servers, CPUs, networking equipment and storage devices in small wiring closets as well as equipment rooms and large data centers. A standard rack typically includes front-mounting rails to which multiple units of equipment, such as servers, are mounted and stacked vertically within the rack. A standard rack can be sparsely or densely populated with a variety of different components including components from different manufacturers.

Most rack-mounted communications and information technology equipment consumes electrical power and generates heat. The heat collectively generated in densely packed equipment racks can have adverse effects on the performance, reliability and useful life of the equipment in the racks. Accordingly, air cooling systems are often a part of an efficient data center design. In particular, many air conditioning (e.g. cooling) systems, such as described in U.S. Pat. No. 6,374,627, include a raised floor to facilitate the system's air cooling and circulation functions. These systems typically use open floor tiles and floor grilles, perforated tiles, or vents to deliver cool air into the room of racks from the air passageway disposed below the raised floor of an equipment room. Perforated tiles are typically located in front of the equipment racks and enclosures. The cool air flows from below the raised floor to the front side of the equipment racks or enclosures.

Rack-mounted equipment is often cooled by air that flows along a front side or air inlet side of a rack, through the rack, and out the rear or exhaust side of the rack. Often, the rate of the airflow across the heat generating components within the rack is dependent on the size and speed of one or more fans located within the equipment. Consequently, the ability for the airflow to transfer heat away from the heat-sensitive components is heavily dependent on the inlet temperature of the air.

A common configuration of equipment in a data center has the racks in rows, where the inlet sides of the rows are arranged face to face. Grilles or perforated tiles are located in the raised floor structure between the two faces of the rows. This configuration is commonly called a "cold aisle" because the cool air from the air cooling system flows through the raised floor, through the perforated tiles and into an aisle between the rows. The cool air is then drawn into the rack mounted equipment and exhausted to the space behind (typically a "hot aisle") or above the rows.

In an effort to provide an inlet air temperature that is sufficient to adequately cool large amounts of rack-mounted components, the capacity of a data center air conditioner may provide a combination of cold air at a high flow rate. Such high capacity air conditioners often use additional humidification/de-humidification systems to control the moisture in the air in the data center. Such humidification/de-humidification systems can be expensive to install and operate.

SUMMARY OF THE INVENTION

In general, in an aspect, the invention provides a system for use in a data center, the system including racks configured to house rack-mounted components, each of the racks having a front face to intake air, where the racks are arranged in a first row and a second row horizontally displaced from each other such that the front faces of racks of the first row are facing the front faces of the racks in the second row to define a cold aisle between the front faces. The system also includes a cold air delivery mechanism configured to deliver cold air to the cold aisle, and a first baffle extending at least partially between the front face of a first rack in the first row and the front face of a first rack in the second row being configured to inhibit horizontal airflow into and out of the cold aisle, where air within the cold aisle is relatively cooler than air located within the data center but outside of the cold aisle.

Implementations of the invention may include one or more of the following features. The first baffle is a door that extends substantially across an entire gap between the first row and the second row. The door includes a window. The door is pivotably connected to the first row, and is releasably latched to the second row when the door is in a closed position. The system further includes a track coupled to an end of the first row, wherein the door is slidably attached to the track, and is releasably latched to the second row when the door is in a closed position. The door is constructed of a flexible material.

Also, implementations of the invention may include one or more of the following features. The first baffle is pivotably coupled to the first rack of the first row. The height of the first baffle is substantially similar to the height of the first row. The system includes a second baffle extending at least partially between a front face of a second rack of the first row and a front face of a second rack of the second row and being configured to inhibit horizontal airflow into and out of the cold aisle. The system further includes a second baffle extending at least partially between the front face of the first rack of the first row and the front face of the first rack of the second row and being configured to inhibit horizontal airflow into and out of the cold aisle. The combined length of the first baffle and the second baffle substantially spans an entire distance between the first row and the second row.

Also, implementations of the invention may include one or more of the following features. The system further includes a third baffle disposed near a top of the front face of the first row, the third baffle extending at least partially along a length of the first row and being configured to inhibit airflow over the top of the first row and into the cold aisle. The first baffle comprises a flexible material. The first row includes a first section and a second section, where the first section is separated from the second section, the system further including a fourth baffle disposed at least partially between the first section and the second section and configured to inhibit horizontal airflow into and out of the cold aisle. The fourth baffle is a door that extends substantially across an entire gap between the first section and the second section.

In general, in another aspect, the invention provides a method of cooling electronic equipment contained in racks in a data center. The method includes providing cool air to a first region between two rows of racks, including a first row and a second row that is substantially parallel to the first row, with a front face of at least one of the racks of the first row facing towards a front face of at least one of the racks of the second row, inhibiting the cool air from horizontally exiting from the first region through a gap between a first rack of the first row and a first rack of the second row, exhausting warm air from the electronic equipment out of at least one of the racks in at least one of the rows, inhibiting the warm air from horizontally entering the first region through the gap, and allowing a person to access the first region via the gap.

Implementations of the invention may include one or more of the following features. The method further includes inhibiting the cool air from exiting from the first region to a second region above the first row and the second row. The method further includes exhausting the warm air out of the data center. Allowing access includes selectively allowing the person access to the first region via the gap.

In general, in another aspect, the invention provides a data center system including equipment racks configured to house rack-mounted electronic heat-producing equipment, each of the racks having a front face to allow air to be drawn into the racks, where the racks are arranged such that the front faces of the racks face a common area, a connection panel connected between a first and a second rack of the equipment racks and configured to inhibit horizontal air flow into or out of the common area, at least one door coupled between at least two racks and configured to allow selective access to the common area and to inhibit horizontal air flow into and out of the common area, and an air cooling system configured and disposed to provide cool air to the common area.

Implementations of the invention may include one or more of the following features. The door includes a translucent portion. The connection panel includes a translucent portion. The system further includes a roof that substantially covers the common area. The roof is selectively openable. The system further includes at least one roof section connected near a top of at least one of the equipment racks, where the roof section is configured and disposed to inhibit air flow from above the at least one of the equipment racks into the common area. The roof section extends from the front face of the at least one equipment rack over at least a portion of the common area. The system further includes at least a further connection panel, where each panel is connected to at least one of the equipment racks and configured to inhibit horizontal air flow into or out of the common area. The equipment racks are disposed in a horseshoe arrangement around the common area and the door is disposed across an opening of the horseshoe arrangement and configured to inhibit horizontal air flow into or out of the common area.

In accordance with implementations of the invention, one or more of the following capabilities may be provided. Existing data centers can be easily modified in accordance with the invention. Different cooling needs of particular data centers can be accommodated. Mixing of cool air and warm exhaust air in a data center can be inhibited. A data room can be modified in accordance with the invention with little or no modification to its structure, e.g., data center lighting, sprinkler systems, security systems, etc. Data center cooling efficiency can be improved. Data centers with higher capacity relative to traditional data center arrangements can be realized. Horizontal and/or vertical cooling distribution can be more even relative to prior systems. Cooling performance can be less dependent on rack installation locations, and more rack installation locations may be utilized than in prior data centers.

These and other capabilities of the invention, along with the invention itself, will be more fully understood after a review of the following figures, detailed description, and claims.

DETAILED DESCRIPTION OF THE INVENTION

Embodiments of the invention provide techniques for inhibiting warm air from being entrained into a cold aisle in a data center. For example, a data center contains an air cooling system and a raised floor structure. The raised floor structure is configured to permit delivery of cool air into the data center through perforated tiles in the floor. Electronic equipment racks are disposed in rows on either side of the perforated tiles, such that the front side of one row faces the front side of another row with the perforated tiles located in the aisle between the front faces of the rows. A baffle extends between the rows to restrict airflow into and out of the aisle between the front faces of the rows. Other embodiments are within the scope of the invention.

Figure 1:
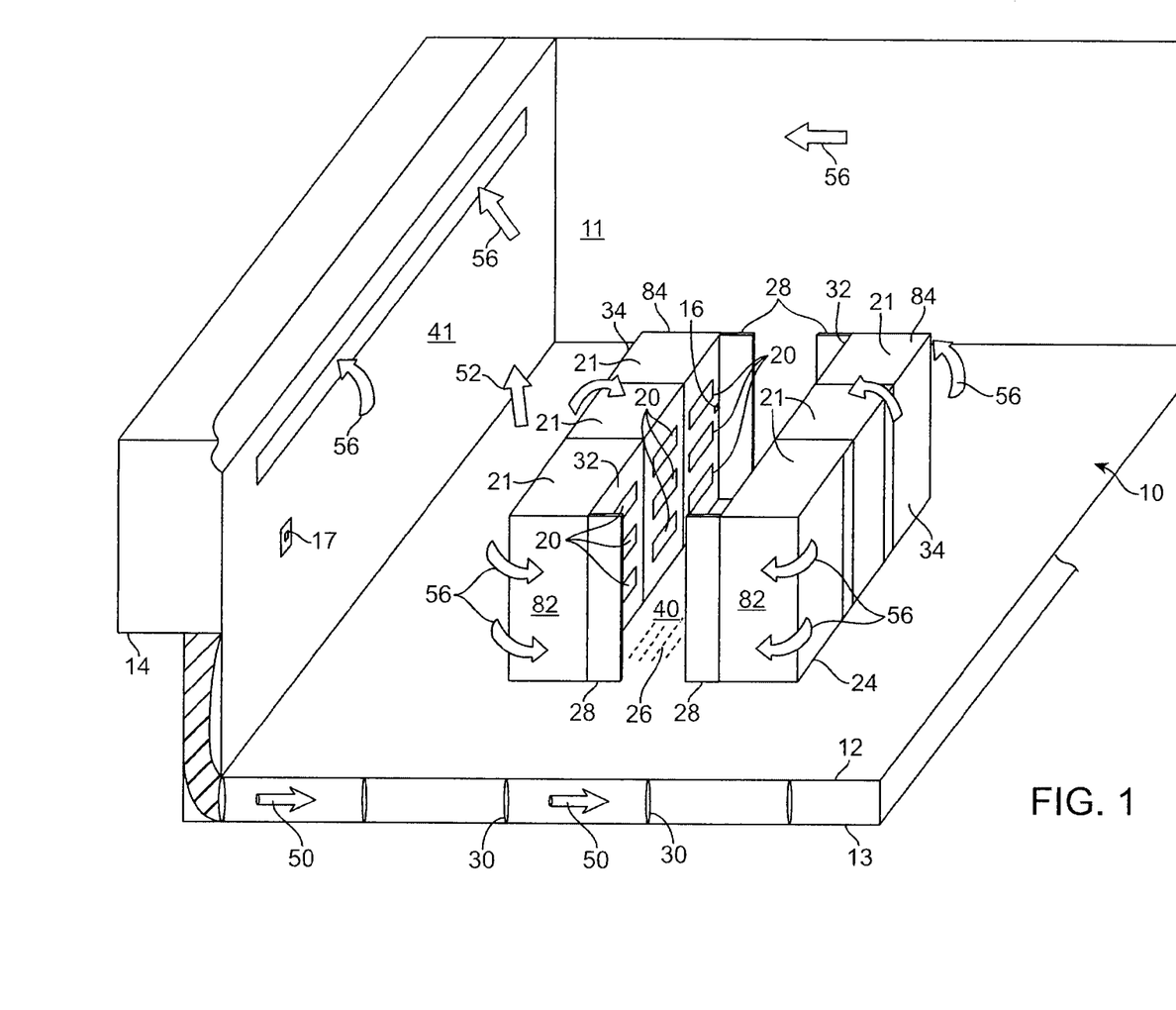
FIG. 1 is a simplified perspective view of a data center.
Figure 2:
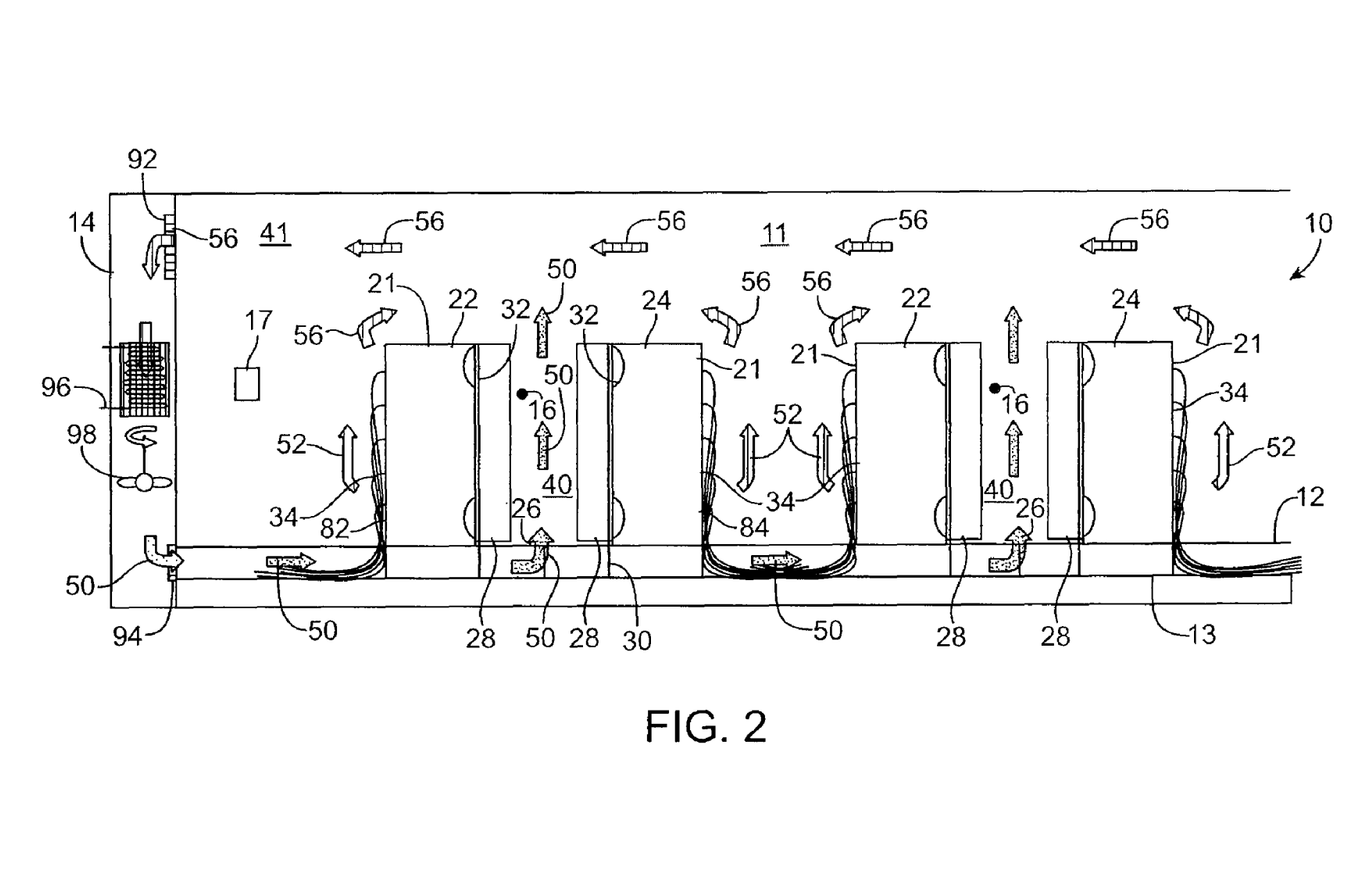
FIG. 2 is a simplified side elevation view of the data center shown in FIG. 1.

Referring to FIG. 1, a data center (10) includes a room (11), a raised floor (12), a sub-floor (13), an air cooling system (14), temperature monitoring devices (16, 17), two sets of equipment racks (21) disposed in two rows (22, 24), electronic components (20) in the racks (21), perforated tiles (26), and baffles (28). While only two rows (22, 24) are shown in FIG. 1, the room (11) includes more rows of racks (21) as shown in FIG. 2 discussed below. Supporting the raised floor (12) are vertical support elements (30) of sufficient strength to support the equipment racks (21). The rows (22, 24) have front inlet sides (32) and rear exhaust sides (34). A cold aisle (40) is formed between the two rows (22, 24) and above the perforated tiles (26) such that the inlet side (32) of the first row (22) faces the inlet side (32) of the second row (24). The perforated tiles (26) are made of strong material to support personnel, not shown, who may walk in the cold aisle (40), e.g., to perform service and maintenance functions. Preferably, the air cooling system (14) is configured to draw air in from an upper region (41) of the data center (10), and to force cold air between the raised floor (12) and the sub-floor (13), and through the perforated tiles (26). Optional air temperature sensors (16) in the cold aisle (40) monitor and record the air temperature in the cold aisle (40).

Referring also to FIG. 2, the data center (10) includes two pairs of rows (22, 24) of racks (21), although data centers with more or fewer rows of racks may be used. Cold aisles (40) are formed between each pair of rows (22, 24) and above the perforated tiles (26) such that the inlet side (32) of the first rows (22) faces the inlet side (32) of the second rows (24). The air cooling system (14) includes an inlet filter (92), an exhaust filter (94), cooling coils (96), and a fan (98). The air cooling system (14) forces the cold air (50) into the cold aisles (40) bounded by the rows (22, 24) of racks (21) and the baffles (28).

The baffles (28) are configured to impede air from horizontally entering or exiting the cold aisles (40). Here, the baffles (28), which are approximately the same height as the rows, are attached to ends (82, 84) of each pair of rows (22, 24). The baffles (28) extend from the front faces (32) of each of the rows (22, 24) toward the opposing row (24, 22). The baffles (28) may be positioned and configured to allow clear lines of sight into the cold aisles (40). Here the baffles (28) extend only partially between the rows (22, 24), leaving a gap between the baffles (28) to allow viewing of the cold aisle (40) from outside the cold aisle (40). Alternatively, or additionally, one or more of the baffles (28) may include a window or other mechanism to allow viewing of the cold aisle (40).

The baffles (28) may be disposed between a pair of rows (22, 24) without being attached to the rows (22, 24). For example, the baffles (28) may be connected to the raised floor (12) directly, or via a portable base which is capable of supporting the baffle (28) in the desired position. The baffles (28) may be attached to the rows (22, 24) at various locations and in various manners. For example, the baffles (28) may be attached at the ends (82, 84) of the rows (22, 24) or displaced from the ends (82, 84) of the rows (22, 24), e.g., inboard of the ends (82, 84). The baffles (28) need not have the same configuration or location at both ends (82, 84) of the rows (22, 24). The baffles (28) may be mounted to the rows (22, 24) with hinges to allow the baffles (28) to pivot/swing into or away from the cold aisles (40). Two baffles (28) can be similarly mounted to opposing rows (22, 24) to create a swinging door between a pair of rows (22, 24). The hinges may accommodate baffles (28) with ridged or flexible seals (e.g., living hinges, with the hinge being a flexible portion of the baffle (28)). The baffles (28) may also be mounted on tracks to create a sliding door between a pair of rows (22, 24).

The baffles (28) may be constructed in a variety of ways and of a variety of materials. For example, the baffles (28) may be made of a solid material such as plastic, wood, metal, or a combination of these, e.g., being configured as curtains. Further, not all baffles (28) in the data center (10) need to be configured similarly. The baffles (28) may also be flexible, e.g., made of a thin metal, thin plastic, or fabric, or a combination of these. The baffles (28) may be made of a combination of solid and flexible material such as a solid frame supporting a flexible center, or a solid rod supporting a flexible curtain.

Figure 3:
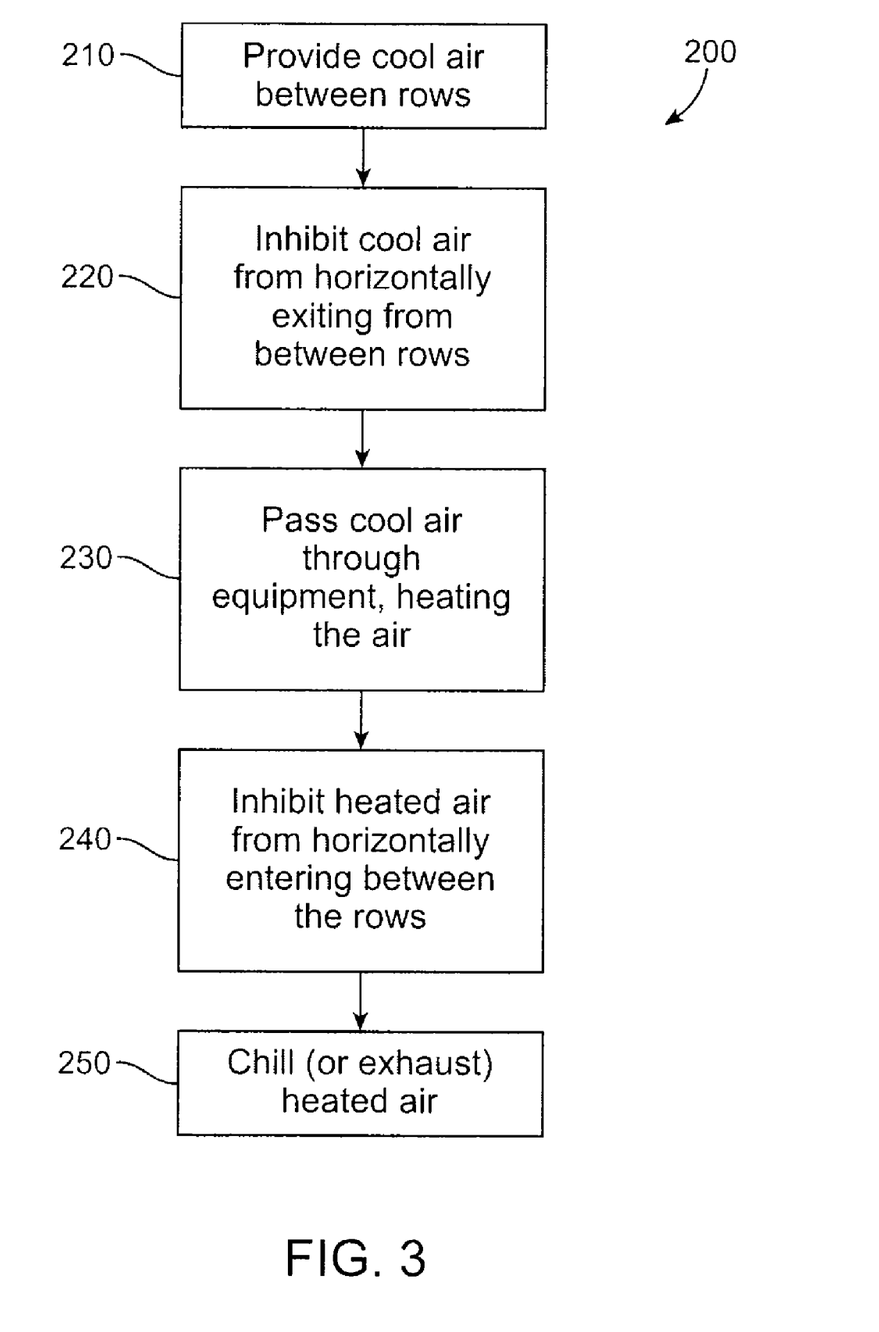
FIG. 3 is a block flow diagram of a process to impede horizontal airflow into and out of a cold aisle.

In operation, referring to FIG. 3, with further reference to FIG. 1 and FIG. 2, a process (200) for cooling the data center (10) includes the stages shown. The process (200), however, is exemplary only and not limiting. The process (200) may be altered, e.g., by having stages added, removed, or rearranged.

At stage (210), the air cooling system (14) provides cool air (50) to the area between the raised floor (12) and the sub-floor (13). The air cooling system (14) propels the cool air (50) through the perforated tiles (26) and into the cold aisle (40). Other air cooling systems may also be utilized to provide cool air between the rows (22, 24) (e.g., rack mounted cooling units, or a portable unit such as the APC NETWORK AIR™ self-contained air cooling system).

At stage (220), the cool air (50) enters the cold aisle (40) from the perforated tiles (26). The baffles (28) provide resistance to the horizontally flowing components of the cool air (50) in the cold aisle (40). The baffles (28) impede the cool air (50) from horizontally exiting the cold aisle (40). The baffles (28) help direct/guide the flow of the cool air (50) in a vertical direction. The outwardly flowing components of cool air (50) in the cold aisle (40) are bounded and redirected by the rows (22, 24) and the baffles (28).

At stage (230), fans in the racks (21) and/or the internal fans in the electronic components (20) located in the racks (21) draw air to cool their internal components. The fans are configured and disposed to draw cool air (50) into the inlet side (32) of the rows (22, 24) such that the air passes through the electronic components (20) and rises in temperature. The respectively warmer air (52) is expelled through the exhaust sides (34) back into room (11) of the data center (10) as indicated by arrows (52).

At stage (240), a portion of the respectively warm air (56) is entrained by the cool air (50) around the sides of the rows (82, 84). The baffles (28) impede the respectively warmer air (56) from horizontally entering the cold aisle (40). The baffles (28) provide resistance to the horizontally flowing components of the respectively warmer air (56). The baffles (28) help direct/guide the flow of the respectively warmer air (56) in a vertical direction. The rows (22, 24) and baffles (28) hamper the mixing of respectively warmer air (56) with the cool air (50) in the cold aisle (40).

At stage (250), the respectively warmer air (56) is drawn into the air cooling system (14) to be converted into cool air (50). In other processes, the respectively warmer air (56) can be exhausted out of the data center (10) to be replaced by fresh cool air (50).

Figure 4:
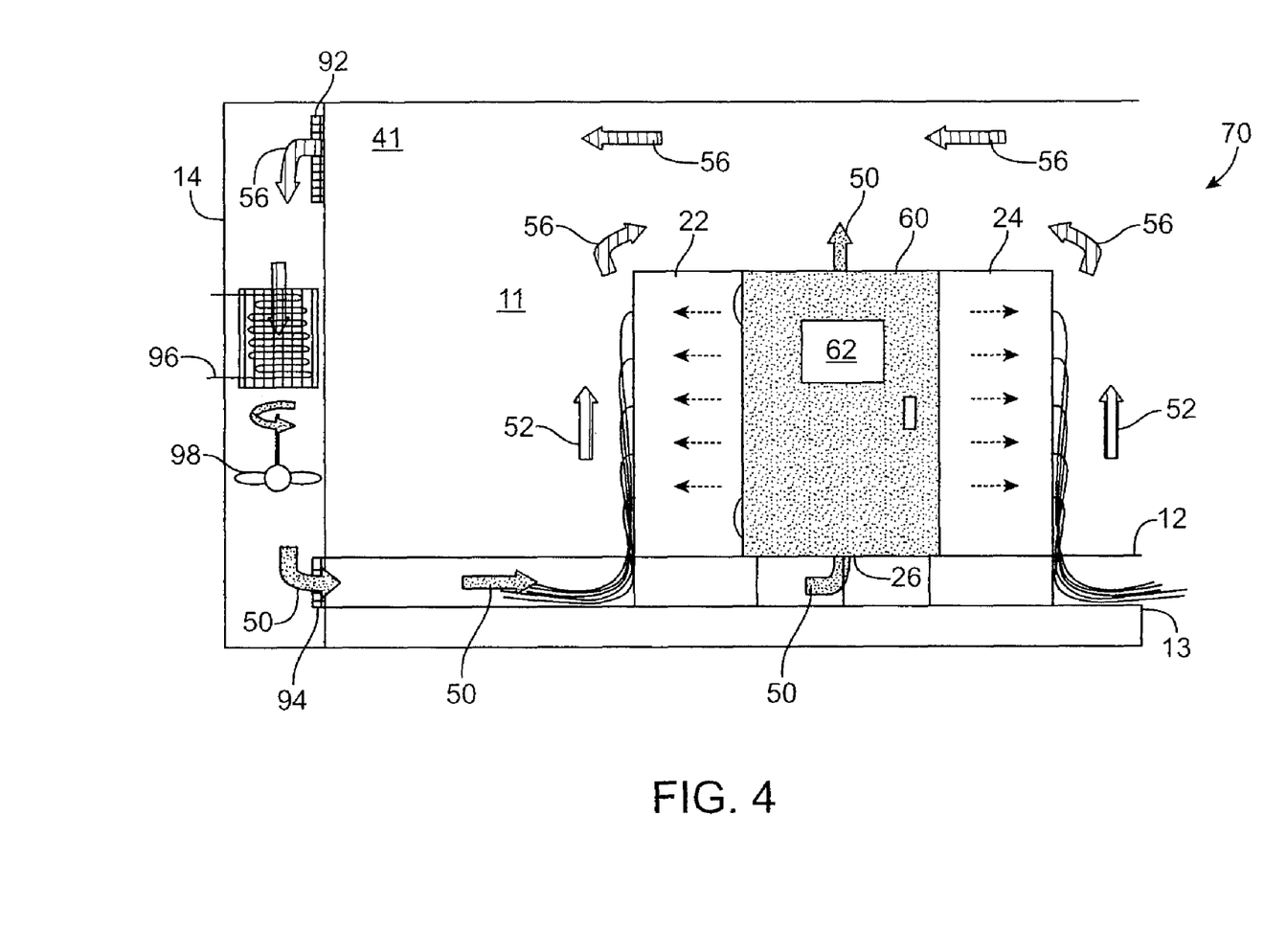
FIG. 4 is a simplified side elevation view of another embodiment of a data center.

Referring to FIG. 4, a data center (70) is similar to the data center (10) shown in FIG. 2. In the data center (70), however, a baffle disposed at the end of the rows (22, 24) is a pivoting door (60) that extends across substantially the entire gap between the rows (22, 24). The door (60) is configured to impede air from horizontally entering or exiting the cold aisle (40). Here, the door (60), which is approximately the same height as the rows (22, 24), is attached to the end of each row (22, 24), although it may be disposed elsewhere. The door (60) extends across a width of the cold aisle (40) between the rows (22, 24), is pivotably connected to the row (22) and is releasably latched to the row (24) when in a closed position, as shown. The door (60) includes a window (62) to allow for viewing the cold aisle (40) from outside the cold aisle (40) while the door (60) is closed. The window (62) is preferably positioned at about eye level of most people, e.g., extending from about 60" above the raised floor (12) to at least about 72" above the raised floor (12).

Figure 5:
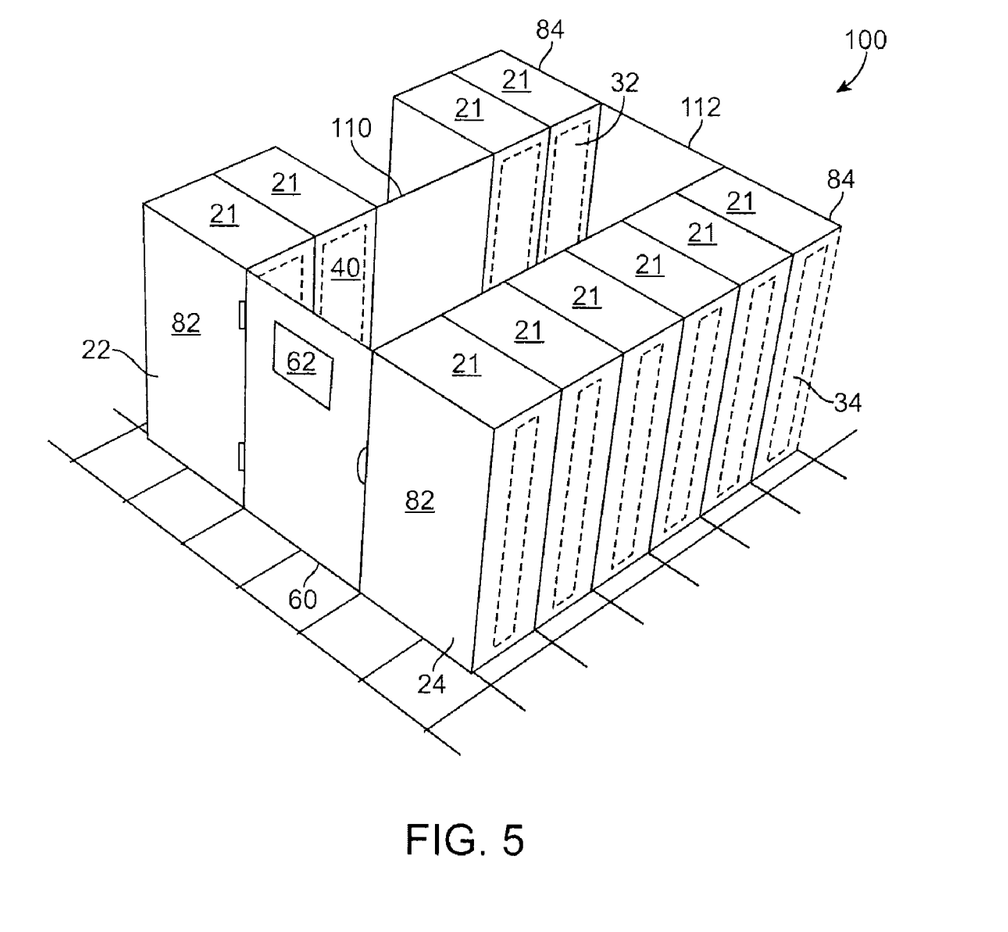
FIG. 5 is a simplified perspective view of a data center with a mid-row panel in a row of racks.

Referring to FIG. 5, a data center (100) is similar to the data center (70) shown in FIG. 4. In the data center (100), however, a mid-row baffle (110) is disposed between two racks (21) in the first row (22). The mid-row baffle (110) is configured to impede air from horizontally entering or exiting the cold aisle (40). Here, the mid-row baffle (110), which is approximately the same height as the first row (22), is attached to the front faces (32) of two of the racks (21) in the first row (22), although it may be disposed elsewhere in the first or second row (22, 24) (e.g., a location between the front face (32) and the exhaust side (34) of the racks (21) in the first or second row (22, 24)). The mid-row baffle (110) may include a window or translucent portion to allow for viewing the cold aisle (40) from outside the cold aisle (40). This mid-row baffle (110) helps impede horizontal flow into or out of the cold aisle (40), and helps complete the row (22) as a substitute for one or more racks (21).

Figure 6:
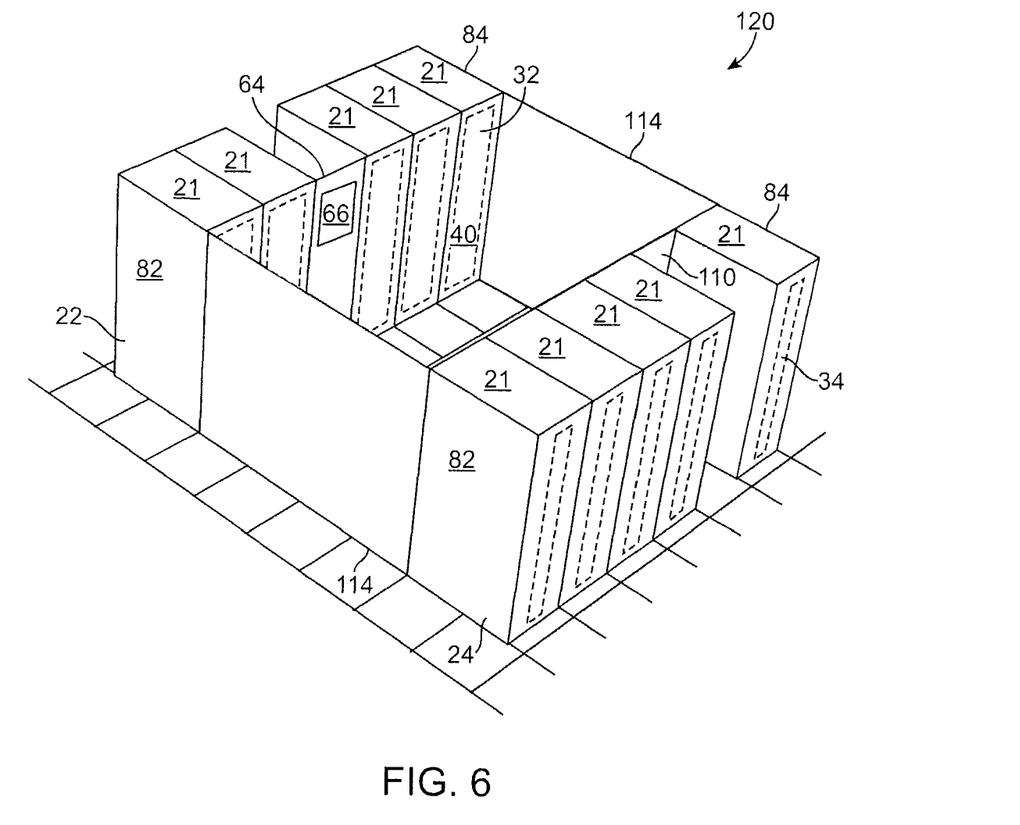
FIG. 6 is a simplified perspective view of a data center with a wide aisle configuration.

Referring to FIG. 6, a data center (120) is similar to the data center (100) shown in FIG. 5. In the data center (120), however, the first and second rows (22, 24) are disposed at a greater distance from one another than in the data center (100). Two baffles (114) are disposed at the ends of the first and second rows (82, 84) and extend across substantially the entire gap between the rows (22, 24). The baffles (114) are configured to impede air from horizontally entering or exiting the cold aisle (40). The baffles (114) are approximately the same height as the rows (22, 24) and attached to the ends of each of the rows (82, 84). Here, the baffles (114) are constructed of a single solid material, although other configurations are acceptable, e.g., including flexible materials and partitions (e.g., a door section to allow access to the cold aisle (40)).

A door (64) is disposed between the racks (21) in the first row (22). The door (64) is configured to impede air from horizontally entering or exiting the cold aisle (40). Here, the door (64), which is approximately the same height as the first row (21), is attached to the front faces (32) of two of the racks (21), although it may be disposed elsewhere (e.g., the exhaust side (34) of the rows (22, 24)). The door (64) includes a window (66) to allow viewing into the cold aisle (40) from outside the cold aisle (40).

Figure 7:
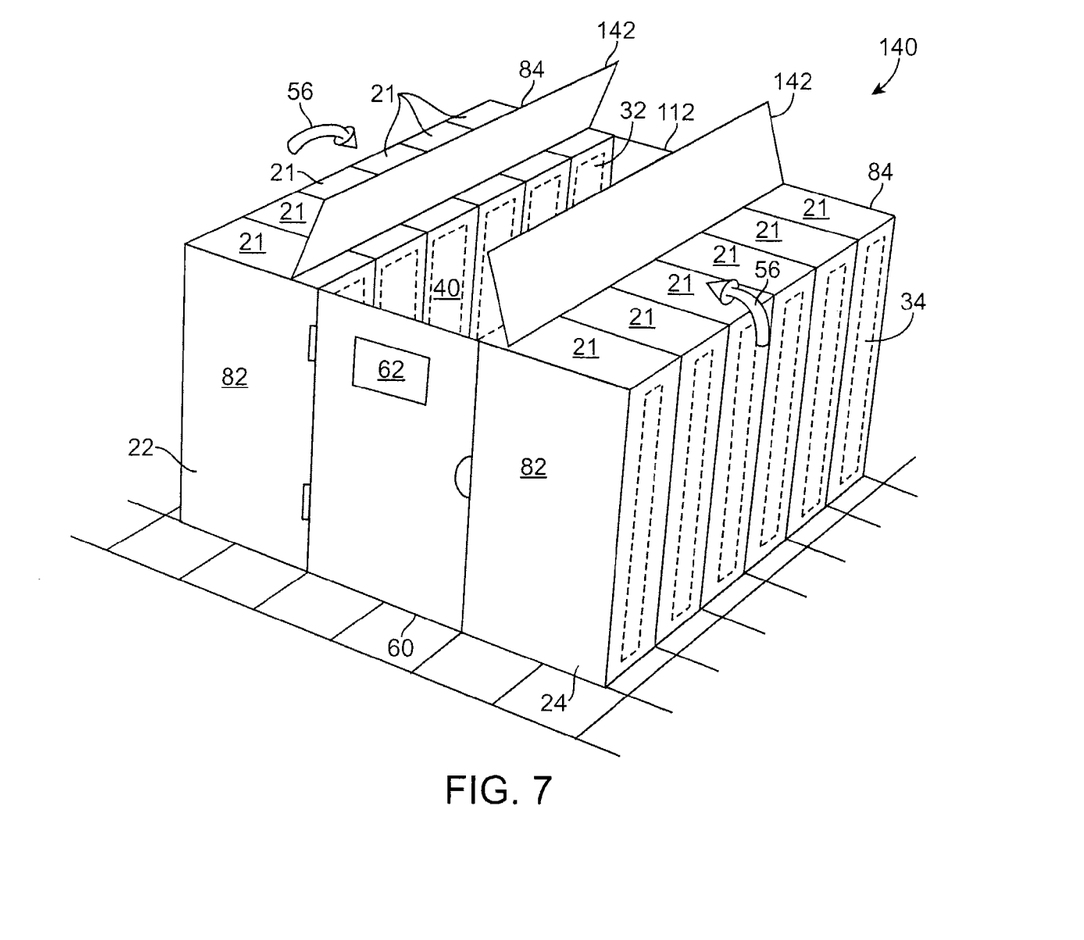
FIG. 7 is a simplified perspective view of a data center with roof baffles.

Referring to FIG. 7, a data center (140) is similar to the data center (100) shown in FIG. 5. The data center (140), however, includes two baffles (142) disposed on tops of the rows (22, 24). The baffles (142) are attached to the top near the front face (32) of the racks (21) in a substantially vertical orientation such that the baffles (142) impede the respectively warmer horizontally flowing air (56) that is entrained over the tops of the rows (22, 24) from entering the cold aisle (40). The baffles (142) are positioned to direct the respectively warmer air (56) in an upwards vertical direction. The baffles (142) can extend substantially across the distance between the top of the front faces (32) of the first and second rows (22, 24), to form a roof on the cold aisle (40). The baffles (142) can be connected (e.g., pivotably) to the racks (21) and configured to inhibit the mixing of the cool air (50) with the respectively warmer air (56) while allowing for data center infrastructure such as lighting and fire suppression systems (e.g., sprinklers or other dispersed fire extinguishing agents). The baffles (142) can be constructed as a continuous piece to extend the length of either row (22, 24), or the baffles (142) may consist of a collection of segments, e.g., with each segment pivotably connected to a rack (21).

Other embodiments of baffles are within the scope of the invention. Additional embodiments of the baffles include, but are not limited to, combinations of single swing doors, double swing (saloon style) doors, sliding doors, and double sliding doors. Door assemblies include both manual and automatic configurations, as well as opaque and translucent materials. Further, baffles can be panels, curtains, or portable screen assemblies. The dimensions of the baffles are not limited to the height and width of the cold aisle, e.g., half doors and integrated service desks are also envisioned. Further, a single baffle may be configured on one or both ends of the rows (22, 24). In other examples, one of the ends (82, 84) of the rows (22, 24) may be installed against a wall in a data center to create a single access point to the cold aisle (40). Access to the cold aisle (40) can be restricted to personal with proper security status (e.g., an electronic identification system, mechanical combination, or other lock and key assembly). Baffles may be disposed across the single access point. In other examples, additional racks (21) are disposed between the rows (22, 24) at the end of the cold aisle (40) to create a horseshoe type configuration. One or more baffles may be disposed between the rows (22, 24) at the open end of the horseshoe configuration.

In other embodiments, baffles can be installed on tracks which are attached to one or both ends (82, 84) of the rows (22, 24). The baffles can move longitudinally along the tracks thereby increasing or decreasing the length of the baffle disposed in the cold aisle (40). As another example, tracks may extend across the cold aisle (40) and along the ends (82, 84) of the rows (22, 24). Two baffles can be mounted on the track and configured to move/slide in opposite directions thereby increasing or decreasing the size of the entrance to the cold aisle (40). Further, a baffle may have an accordion configuration and be disposed between either or both ends (82, 84) of the rows (22, 24). This baffle may be extended across a portion of the gap between the rows (22, 24) and preferably fully across the gap.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

Further, while the description above referred to "the invention," more than one invention may be disclosed.

What is claimed is:

1. A system for use in a data center, the system comprising:
   a plurality of racks configured to house rack-mounted components, each of the racks having a front face to intake air, wherein the plurality of racks are arranged in a first row and a second row horizontally displaced from each other such that the front faces of racks of the first row are facing the front faces of the racks in the second row to define a cold aisle between the front faces, wherein the first row includes a first section and a second section and the first section is separated from the second section;
   a cold air delivery mechanism configured to deliver cold air to the cold aisle;
   a first baffle extending at least partially between the front face of a first rack in the first row and the front face of a first rack in the second row being and configured to inhibit horizontal airflow into and out of the cold aisle, wherein air within the cold aisle is relatively cooler than air located within the data center but outside the cold aisle; and
   a second baffle disposed at least partially between the first section and the second section and configured to inhibit horizontal airflow into and out of the cold aisle.

2. The system of claim 1 wherein the first baffle is a door that extends substantially across an entire gap between the first row and the second row.

3. The system of claim 2 wherein the door includes a window.

4. The system of claim 2 wherein the door is pivotably connected to the first row, and is releasably latched to the second row when the door is in a closed position.

5. The system of claim 1 wherein the first baffle is pivotably coupled to the first rack of the first row.

6. The system of claim 5 wherein a height of the first baffle is substantially similar to a height of the first row.

7. The system of claim 1 further comprising a third baffle extending at least partially between a front face of a second rack of the first row and a front face of a second rack of the second row and being configured to inhibit horizontal airflow into and out of the cold aisle.

8. The system of claim 1 further comprising a third baffle extending at least partially between the front face of the first rack of the first row and the front face of the first rack of the second row and being configured to inhibit horizontal airflow into and out of the cold aisle.

9. The system of claim 8 wherein a combined length of the first baffle and the second baffle substantially spans an entire distance between the first row and the second row.

10. The system of claim 1 further comprising a third baffle disposed near a top of the front face of the first row, the third baffle extending at least partially along a length of the first row and being configured to inhibit airflow over the top of the first row and into the cold aisle.

11. The system of claim 1 wherein the second baffle is a door that extends substantially across an entire gap between the first section and the second section.

12. A data center system comprising:
    a plurality of equipment racks configured to house rack-mounted electronic heat-producing equipment, each of the racks having a front face to allow air to be drawn into the racks, wherein the plurality of racks are arranged such that the front faces of the racks face a common area;

a connection panel connected between a first and a second rack of the plurality of equipment racks and configured to inhibit horizontal air flow into or out of the common area;

at least one door coupled between at least two racks of the plurality of racks and configured to allow selective access to the common area and to inhibit horizontal air flow into and out of the common area; and an air cooling system configured and disposed to provide cool air to the common area, wherein the plurality of equipment racks are disposed in a horseshoe arrangement around the common area and the door is disposed across an opening of the horseshoe arrangement and configured to inhibit horizontal air flow into or out of the common area.

* * * * *